United States Patent
Chan et al.

(10) Patent No.: US 6,828,194 B2
(45) Date of Patent: Dec. 7, 2004

(54) LOW VOLTAGE PROGRAMMABLE AND ERASABLE FLASH EEPROM

(75) Inventors: Tze Ho Simon Chan, Singapore (SG); Yung-Tao Lin, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/338,219

(22) Filed: Jan. 8, 2003

(65) Prior Publication Data

US 2003/0134474 A1 Jul. 17, 2003

Related U.S. Application Data

(62) Division of application No. 09/465,227, filed on Dec. 17, 1999, now Pat. No. 6,518,122.

(51) Int. Cl.[7] ............................................. H01L 21/336
(52) U.S. Cl. ................................ 438/257; 365/185.29
(58) Field of Search ................................ 438/257, 264, 438/266; 257/314; 365/185.03, 185.29, 185.18, 185.26

(56) References Cited

U.S. PATENT DOCUMENTS

| | | | |
|---|---|---|---|
| 4,884,239 A | 11/1989 | Ono et al. .................. 365/185 |
| 5,457,652 A | 10/1995 | Brahmbhatt ............ 365/185.06 |
| 5,659,504 A | 8/1997 | Bude et al. ............. 365/185.27 |
| 5,712,814 A | 1/1998 | Fratin et al. ................. 365/182 |
| 5,828,099 A | 10/1998 | Van Dort et al. ........... 257/314 |
| 5,831,901 A | * 11/1998 | Tang et al. ............. 365/185.03 |
| 5,838,617 A | * 11/1998 | Bude et al. ............. 365/185.18 |
| 5,920,776 A | * 7/1999 | Fratin et al. ................. 438/257 |
| 5,985,716 A | 11/1999 | Shimoji et al. .............. 438/257 |
| 6,147,907 A | * 11/2000 | Thurgate et al. ........ 365/185.18 |
| 6,370,064 B1 | * 4/2002 | Kim ....................... 365/185.29 |
| 6,469,939 B1 | * 10/2002 | Wang et al. ............ 365/185.28 |

* cited by examiner

*Primary Examiner*—Tuan H. Nguyen
(74) *Attorney, Agent, or Firm*—George O. Saile; Rosemary L. S. Pike; Douglas R. Sohnabel

(57) ABSTRACT

A new method of fabricating and programming and erasing a Flash EEPROM memory cell is achieved. A tunneling oxide layer is formed overlying a semiconductor substrate. A first polysilicon layer, an interpoly oxide layer and then a second polysilicon layer are deposited. A second polysilicon layer is deposited overlying the interpoly oxide layer. The second polysilicon layer, the interpoly oxide layer, the first polysilicon layer, and the tunneling oxide layer are patterned to form control gates and floating gates for planned Flash EEPROM memory cells. Ions are implanted to form drain junctions where the drain junctions are shallow and abrupt. Ions are implanted to form angled pocket junctions adjacent to the drain junctions. The angled pocket junctions are implanted at a non-perpendicular angle with respect to the semiconductor substrate and are counter-doped to the drain junctions. Ions are implanted to form source junctions that are deeper and less abrupt than the drain junctions.

4 Claims, 6 Drawing Sheets

BACK BIAS HOT ELECTRON INJECTION PROGRAMMING MECHANISM

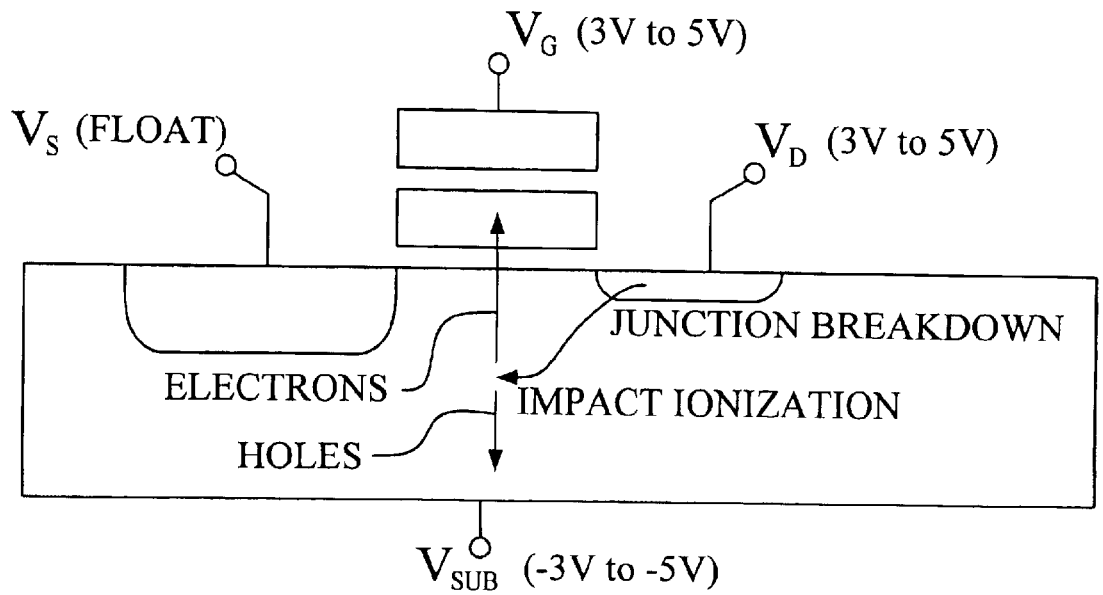
FIG. 9 BACK BIAS HOT ELECTRON INJECTION PROGRAMMING MECHANISM
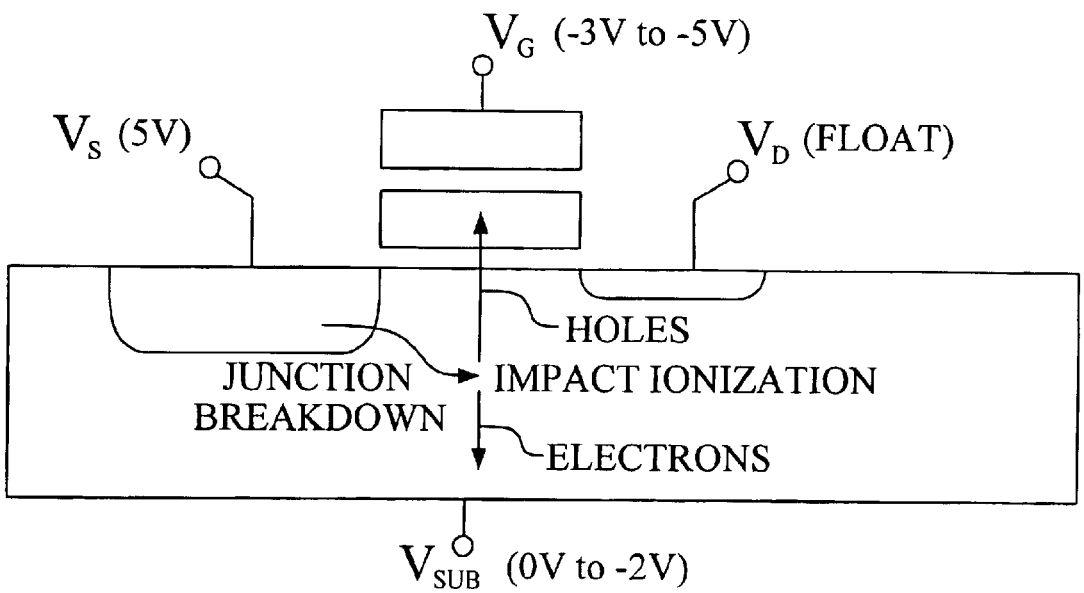
FIG. 10 BACK BIAS HOT HOLE INJECTION ERASE MECHANISM

LOW VOLTAGE PROGRAMMABLE AND ERASABLE FLASH EEPROM

This is a division of patent application Ser. No. 09/465,227, filing date Dec. 17, 1999, now U.S. Pat. No. 6,518,122, Low Voltage Programmable And Erasable Flash Eeprom, assigned to the same assignee as the present invention.

BACKGROUND OF THE INVENTION (1) Field of the Invention

The invention relates to a method of fabricating semiconductor structures, and more particularly, to a method of fabricating a low voltage programmable and erasable FLASH EEPROM and the method of programming and erasing this device.

(2) Description of the Prior Art

Flash EEPROM memories are widely used in the electronics industry. Many applications require the ability to change and retain data after removing the system power. Flash EEPROM offers this capability.

Referring now to FIG. 1, a cross sectional representation of a partially completed prior art integrated circuit device is shown. A Flash EEPROM memory cell of the prior art is depicted. A semiconductor substrate 10 is shown. Shallow Trench Isolations (STI) 14 are formed in the semiconductor substrate 10 to isolate the memory from surrounding cells. A control and floating gate stack has been fabricated overlying the semiconductor substrate 10. The control and floating gate stack comprises a tunneling oxide layer 18 overlying the semiconductor substrate 10. A floating polysilicon gate 22 overlies the tunneling oxide layer 18. An interpoly dielectric layer 26 overlies the polysilicon floating gate 22. A polysilicon control gate 30 overlies the interpoly dielectric layer 26. A drain junction 31 is formed in the semiconductor substrate 10. A source junction 32 is formed in the semiconductor substrate 10 A substrate contact junction 33 is also formed in the semiconductor substrate 10. The junctions, polysilicon layers, and oxide layers are all formed by conventional processes.

The Flash EEPROM memory cell operates essentially as an MOS transistor with a variable threshold voltage ($V_t$). The state of the threshold voltage (high or low) determines the logical state of the memory cell (for example, binary 0 or 1). The voltage threshold of the memory cell depends upon the charge held on the polysilicon floating gate. Assuming that an n-channel device has been constructed, a sufficient positive voltage bias on the control gate ($V_G$) with respect to the substrate ($V_{SUB}$), will cause a conductive channel to form at the surface of the semiconductor substrate 10. The difference between the gate and substrate voltages is called $V_{GSUB}$. If a voltage delta also exists between the drain junction and the source junction ($V_D$-$V_S$, or $V_{DS}$), then current will flow through the channel. However, if the threshold voltage were such that $V_t$ exceeded $V_{GSUB}$, then a conductive channel would not form. Current would not flow from drain to source though the $V_{DS}$ bias existed. Sense circuitry in a memory device utilizing FLASH EEPROM cells determines the state (low $V_t$ or high $V_t$) of the cells by measuring whether or not current flows through the cell when the control gate is selected.

As stated, the presence of charge on the floating gate directly affects the threshold voltage $V_t$ of the cell. The control gate and floating gate are essentially two capacitors in series. Therefore, when a voltage is effected across the control gate to the substrate ($V_{GSUB}$), this voltage is divided between the two capacitors. If a significant charge (positive or negative) exists on the floating gate, this charge cannot escape (under normal, low voltage conditions). Therefore, the charge impacts the voltage division. For example, the presence of a significant negative charge on the floating gate (electrons), will partially offset a positive charge on the control gate (holes) so that the substrate surface underlying the tunnel oxide sees a lower potential. This lower potential requires that fewer electrons be attracted to the substrate surface. The effect of the negative charge on the floating gate is to increase the threshold voltage $V_t$ required to turn the cell ON.

To change the state of the cell, charge must be added or subtracted from the polysilicon floating gate. The path for adding or subtracting charge (holes or electrons) is through the thin tunneling oxide 18. The tunneling oxide is formed, by thermal growth or deposition, as a thin layer of silicon dioxide.

When electrons are added to the floating gate, this is typically called programming the cell. When holes are added to the floating gate, this is called erasing the cell. The method used to program the cell typically involves creating a large control gate to substrate voltage ($V_{GSUB}$) of 10 volts or greater. In most cases, the substrate is grounded, therefore, +10 volts or greater must be applied to the control gate. In addition, the source junction is grounded ($V_S$) and the drain junction is biased to the low voltage supply of between about +3 volts to about +5 volts. In this condition, a sufficient bias exists to cause avalanche or hot electron injection 34 near the drain junction 31 and into the polysilicon floating gate 22. Fowler-Nordheim Tunneling also takes place in the programming scenario. Alternatively, to discharge or erase the cell, the control gate voltage ($V_{GSUB}$) must be biased to −10 volts or greater. The source voltage ($V_{SSUB}$) is biased to the low voltage supply of between about +3 volts to about +5 volts. The drain voltage ($V_{SSUB}$) is left floating. Now, electrons cross from the polysilicon floating gate 22 to the source junction 32 to erase the cell by Fowler-Nordheim Tunneling.

Note that the drain junction 31 is typically more shallow and more highly doped than the source junction 32. This allows the drain junction to avalanche breakdown at a lower voltage which somewhat reduces the large programming and erasing voltage ($V_{pp}$) required to change the logical state of the cell. The large $V_{pp}$ makes integration of the memory cells more difficult. The large voltage requires either that an external voltage supply must be added to the system or that a charge pumping circuit be added to the integrated circuit. Either alternative is expensive. The use of the higher voltage in the circuit also requires that a thicker gate oxide be used in the circuitry that is exposed to this voltage. Again, this is expensive due to added processing complexity.

Several prior art approaches deal with Flash EEPROM devices and programming methods. U.S. Pat. No. 4,884,239 to Ono et al teaches a method to erase EPROM cells where a small source to substrate reverse bias eliminates source to substrate current flow. A large drain to source reverse bias is created to create a current reverse avalanche that injects hot holes into the floating gate to erase the cell. U.S. Pat. No. 5,457,652 to Brahmbhatt discloses a method to program and erase an EEPROM. The substrate is grounded. For programming, a +12 volt bias is applied to the control gate. For erasing, a −10 volt bias is applied to the control gate. U.S. Pat. No. 5,659,504 to Bude et al teaches a device and programming method for an EEPROM. The device uses a shallow drain and a halo or p-pocket drain. Programming and erasing is controlled by the drain to source bias with neither floating. Drain to source current is used to program or erase the cell-through channel hot electron injection. The p-pocket drain is used to increase hot electron injection from the channel current.

SUMMARY OF THE INVENTION

A principal object of the present invention is to provide an effective and very manufacturable method of fabricating a Flash EEPROM memory cell in the manufacture of integrated circuits.

A further object of the present invention is to provide a method of fabricating a Flash EEPROM memory cell with a reduced gate to substrate programming voltage.

A yet further object of the present invention is to provide a method of fabricating a Flash EEPROM memory cell with a reduced programming voltage comprising the features of: implanting a shallow and abrupt drain junction, implanting an angled pocket counter-doped junction adjacent to the drain junction, and implanting a deeper and less abrupt source junction.

Another further object of the present invention is to provide a method of fabricating a Flash EEPROM memory cell with a reduced gate to substrate erasing voltage.

Another yet further object of the present invention is to provide a method of fabricating a Flash EEPROM memory cell with a reduced erasing voltage comprising: implanting a shallow and abrupt drain junction, implanting an angled pocket counter-doped junction adjacent to the drain junction, and implanting a deeper and less abrupt source junction.

Another further object of the present invention is to provide a Flash EEPROM device with a reduced gate to substrate programming voltage with features comprising: a shallow and abrupt drain junction, an angled pocket implant counter doped junction adjacent to the drain junction, and a deeper and less abrupt source junction.

Another further object of the present invention is to provide a Flash EEPROM device with a reduced erasing gate to substrate voltage with features comprising: a shallow and abrupt drain junction, an angled pocket implant counter doped junction adjacent to the drain junction, and a deeper and less abrupt source junction.

Another further object of the present invention is to provide method to program a Flash EEPROM device using a reduced gate to substrate voltage using a back bias hot electron injection mechanism.

Another yet further object of the present invention is to provide method to erase a Flash EEPROM device using a reduced gate to substrate voltage using a back bias hot hole injection mechanism.

In accordance with the objects of this invention, a new method of fabricating a Flash EEPROM memory cell is achieved. A semiconductor substrate is provided. A tunneling oxide layer is formed overlying said semiconductor substrate. A first polysilicon layer is deposited overlying the tunneling oxide layer. An interpoly dielectric layer is deposited overlying the first polysilicon layer. A second polysilicon layer is deposited overlying the interpoly dielectric layer. The second polysilicon layer, the interpoly dielectric layer, the first polysilicon layer, and the tunneling oxide layer are patterned to form control gates and floating gates for planned Flash EEPROM memory cells. Ions are implanted to form drain junctions for planned Flash EEPROM memory cells in the semiconductor substrate where the drain junctions are shallow and abrupt. Ions are implanted to form angled pocket junctions adjacent to the drain junctions. The angled pocket junctions are implanted at a non-perpendicular angle with respect to the semiconductor substrate and are counter-doped to the drain junctions. Ions are implanted to form source junctions where the junctions are deeper and less abrupt than the drain junctions to complete the Flash EEPROM memory cells in the integrated circuit device.

Also in accordance with the objects of this invention, a new Flash EEPROM memory cell device is described. A tunneling oxide overlies the semiconductor substrate. A floating gate of polysilicon overlies the tunneling oxide. An interpoly dielectric overlies the floating gate. A control gate of polysilicon overlies the interpoly dielectric. A shallow and abrupt drain junction lies within the semiconductor substrate adjacent to the tunneling oxide layer. An angled pocket junction lies within the semiconductor substrate adjacent to the drain junction and counter-doped to the drain junction. A deeper and less abrupt source junction lies within the semiconductor substrate.

Also in accordance with the objects of this invention, a method of programming a Flash EEPROM memory cell is described. A voltage is applied to the drain junction of the cell to effect a low positive bias above a common ground reference. A voltage is applied to the control gate of the cell to effect a low positive bias above the common ground reference. A voltage is applied to the substrate of the cell to effect a low negative bias below the common ground reference. The source junction of the cell is allowed to float. The floating gate of the cell charges by back bias hot electron injection sufficiently to program the cell.

Also in accordance with the objects of this invention, a method of erasing a Flash EEPROM memory cell is described. A voltage is applied to the source junction of the cell to effect a low positive bias above a common ground reference. A voltage is applied to the control gate of the cell to effect a low negative bias below the common ground reference. A voltage is applied to the substrate of the cell to effect a low negative bias below the common ground reference. The drain of the cell is allowed to float. The floating gate of the cell discharges by back bias hot hole injection sufficiently to erase the cell.

BRIEF DESCRIPTION OF THE DRAWINGS

In the accompanying drawings forming a material part of this description, there is shown:

FIGS. 9 and 10 schematically illustrate the programming and erasing mechanism of the present invention.

DESCRIPTION OF THE PREFERRED EMBODIMENTS

The embodiment discloses the application of the present invention to the formation of a Flash EEPROM memory cell in the manufacture of an integrated circuit device. A method to program and to erase the Flash EEPROM memory cell is also disclosed. It should be clear to those experienced in the art that the present invention can be applied and extended without deviating from the scope of the present invention.

Figure 1:
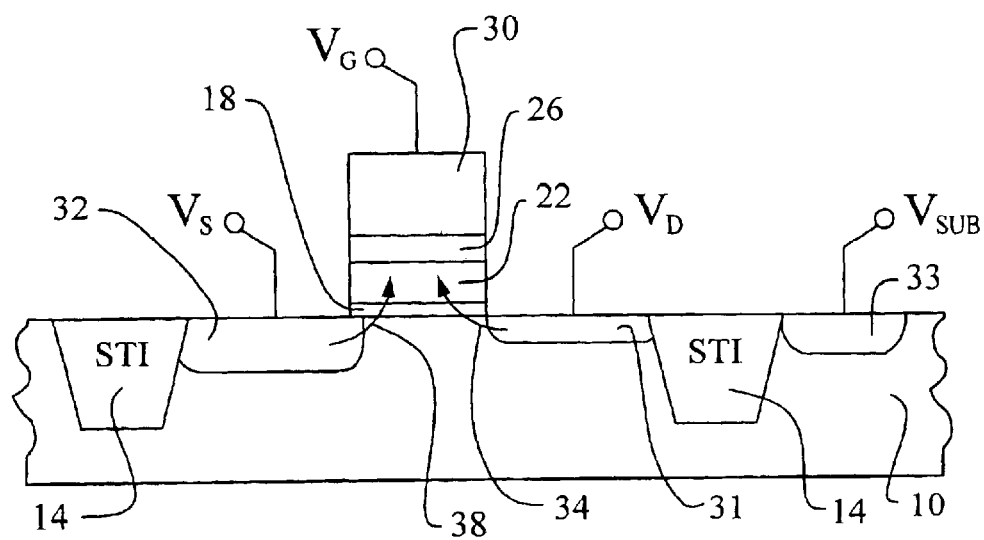
FIG. 1 schematically illustrates in cross-sectional representation a partially completed prior art integrated circuit device.
Figure 2:
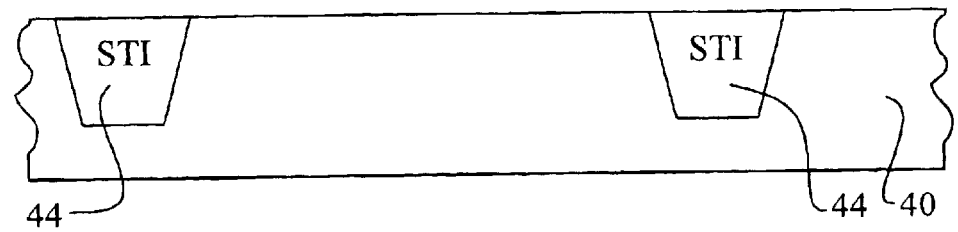
FIGS. 2 through 8 schematically illustrate in cross-sectional representation a preferred embodiment of the present invention.

Referring now particularly to FIG. 2, there is shown a cross section of a partially completed integrated circuit device of the preferred embodiment. A semiconductor substrate 40, typically consisting of monocrystalline silicon, is provided. In this application, the semiconductor substrate is lightly doped p-type. Shallow trench isolations (STI) 44 are formed in the semiconductor substrate 40 to isolate the Flash EEPROM memory cells. The STI structures 44 are formed by a conventional process.

Figure 3:
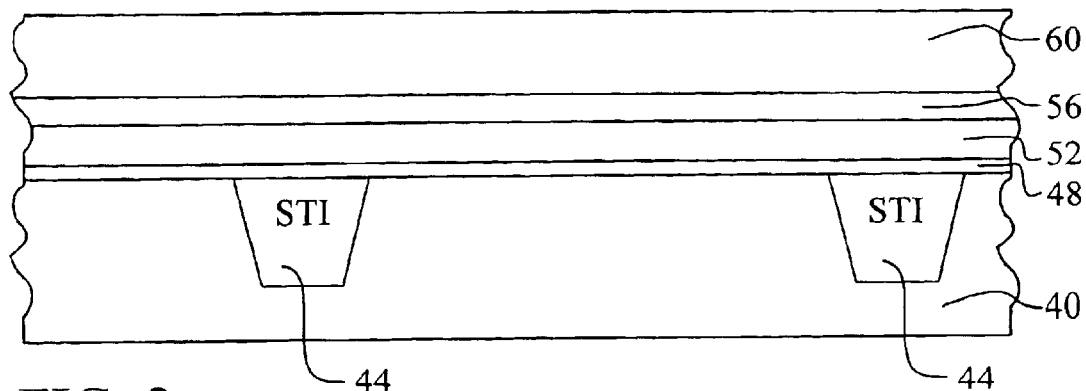

Referring now to FIG. 3, a tunneling oxide layer 48 is formed overlying the semiconductor substrate 40. The tunneling oxide layer 48 may be formed either by a thermal oxidation of the semiconductor substrate 40 or by a chemical vapor deposition (CVD) process. The tunneling oxide layer 48 is formed to a thickness of between about 90 Angstroms and 100 Angstroms. A first polysilicon layer 52 is deposited overlying the tunneling oxide layer 48. The first polysilicon layer 52 will be formed into the floating gate of the memory cell. The first polysilicon layer 52 is preferably deposited using a low-pressure CVD process. The first polysilicon layer is deposited to a thickness of between about 1500 Angstroms and 1700 Angstroms. An interpoly dielectric layer 56 is deposited overlying the first polysilicon layer 52. The interpoly dielectric layer 56 is deposited to a thickness of between about 100 Angstroms and 120 Angstroms. The interpoly dielectric layer 56 can be comprised of silicon dioxide, silicon nitride, or combinations of both silicon dioxide and silicon nitride. A second conducting layer 60 is deposited overlying the interpoly dielectric layer 56. The second conducting layer 60 will be formed into the control gate of the memory cell. The second conducting layer 60 may comprise polysilicon or another conducting material. The second conducting layer 60 is preferably deposited using a low-pressure CVD process. The second conducting layer 60 is deposited to a thickness of between about 1500 Angstroms and 2000 Angstroms.

Figure 4:
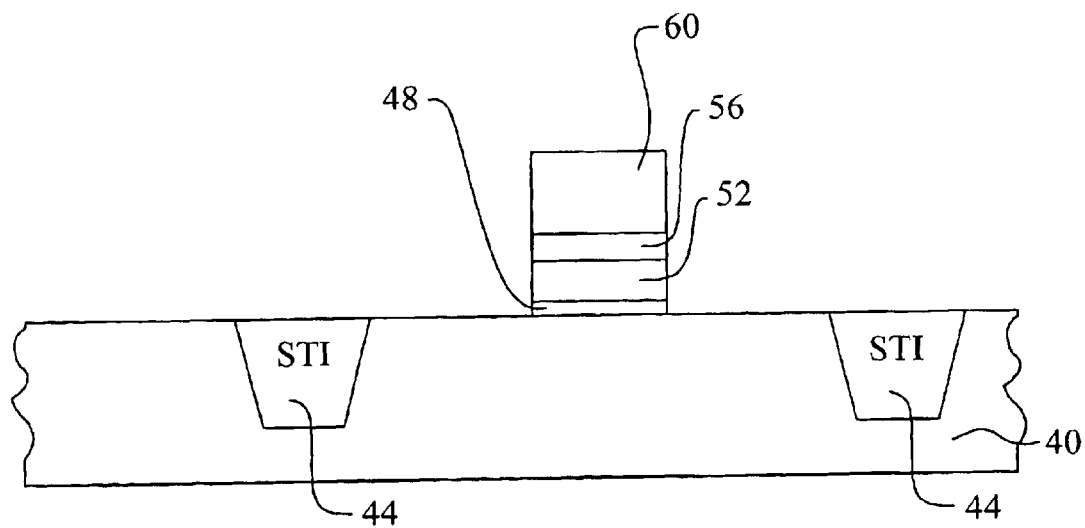

Referring now to FIG. 4, the second conducting layer 60, the interpoly dielectric layer 56, the first polysilicon layer 52, and the tunneling oxide layer 48 are etched through to form the control gate 60 and the floating gate 52 of the Flash EEPROM memory cell. A conventional etching process is used to etch through the layers.

Figure 5:
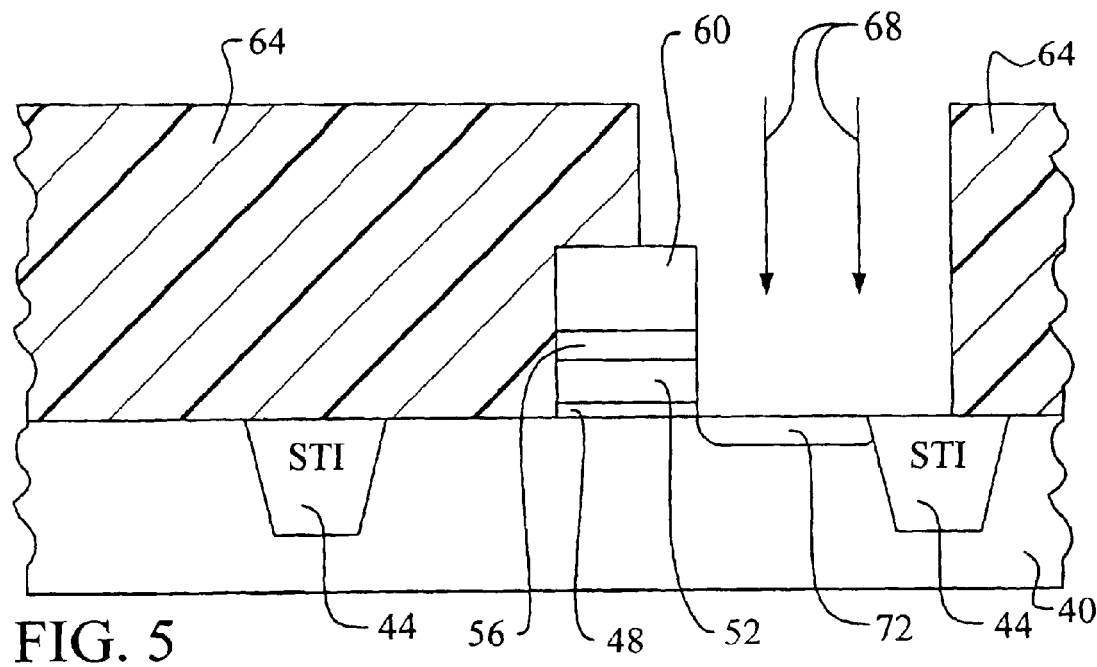

Referring now to FIG. 5, an important feature of the present invention is disclosed. Ions are implanted to form shallow and abrupt drain junctions 72 for the memory cells. A masking layer 64, here shown as a photoresist layer 64, is patterned overlying the semiconductor substrate 40 and the control gate 60 and floating gate 52 stack. The patterning exposes areas where drains 72 for the memory cells are planned. Ions are implanted 68 through the openings in the masking layer 64. By forming the drain junctions with a shallow profile and very abrupt concentration gradient, the reverse-bias avalanche breakdown voltage of the drain junction is low. This low breakdown voltage is important because the memory cell design of the present invention uses the drain junction avalanche breakdown to generate hot electrons for the programming of the floating gate.

The ionic species for the drain implant 68 comprises either arsenic or antimony. The ions are implanted with a dose of between about $6 \times 10^{14}$ atoms/cm$^2$ and $8 \times 10^{14}$ atoms/cm$^2$ and energy of between about 50 KeV and 60 KeV. The drain junctions 72 formed by this implantation 68 have a junction depth of between about 0.2 microns and 0.3 microns and a doping ion concentration of between about $1 \times 10^{20}$ atoms/cm$^3$ and $2 \times 10^{20}$ atoms/cm$^3$.

Figure 6:
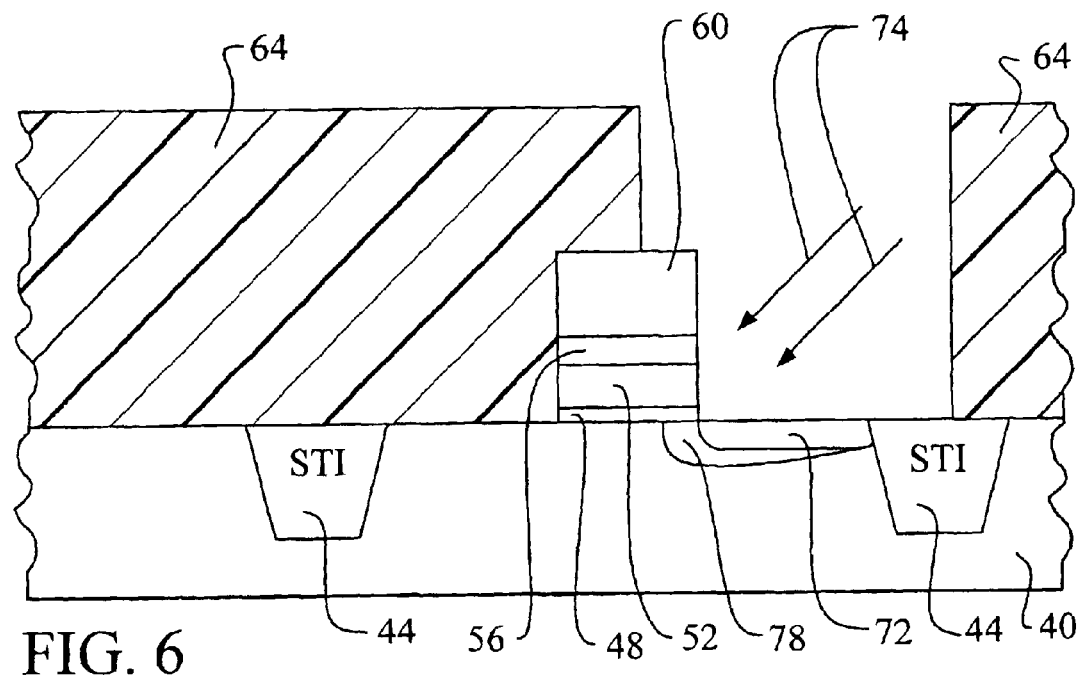

Referring now to FIG. 6, another important feature of the present invention is described. Ions are implanted 74 to form angled pocket junctions 78 adjacent to the drain junctions 72 of the memory cells and underlying the gate stack. The masking layer 64 used for the drain junction implant can be used again for the angled pocket junction implant. Ions are implanted 74 through the openings in the masking layer 64. The ions are implanted 74 at a non-perpendicular angle of between about 30 and 45 degrees with respect to the semiconductor substrate 40 as shown. The angled pocket junctions 78 formed are counter-doped to the doping type of the drain junctions 72. The purpose of the counter-doped, angled pocket junctions 78 is to enhance the avalanche breakdown characteristic of the drain junctions 72. The presence of a counter-doped region of relatively high concentration adjacent to the drain junction 72 will further decrease the reverse bias breakdown voltage. The use of an angled implantation 74 allows the angle pocket junction to extend under the tunneling oxide 48 of the memory cell. In this way, the drain junction 72 still underlies the edge of the tunneling oxide 48 so that proper channel inversion can occur.

The ionic species for the angled pocket junction implant 74 comprises boron. The ions are implanted with a dose of between K about $3 \times 10^{13}$ atoms/cm$^2$ and $6 \times 10^{13}$ atoms/cm$^2$ and an energy of between about 30 Key and 40 KeV and an angle of implantation of between about 30 degrees and 45 degrees with respect to the surface of the semiconductor substrate 40. The angled pocket junctions 78 formed by this implantation 74 have a junction depth or between about 0.3 microns and 0.4 microns and a doping ion concentration of between about $1 \times 10^{17}$ atoms/cm$^3$ and $5 \times 10^{17}$ atoms/cm$^3$.

Figure 7:
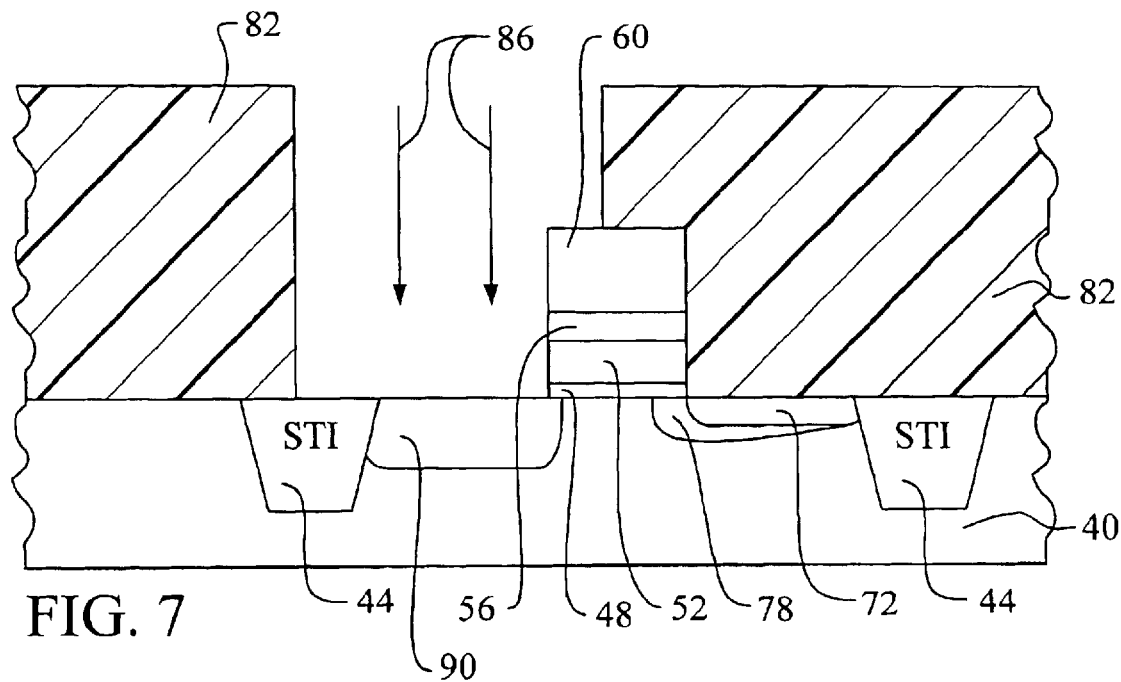

Referring now to FIG. 7, another important feature of the present invention is disclosed. Ions are implanted to form deeper and less abrupt source junctions 90 for the memory cells. A masking layer 82, here shown as a photoresist layer 82, is patterned overlying the semiconductor substrate 40 and the control gate 60 and floating gate 52 stack. The patterning exposes areas where sources 90 for the memory cells are planned. Ions are implanted 86 through the openings in the masking layer 82. By forming the source junctions with a deeper profile and less abrupt concentration gradient, the adverse effect of tunneling oxide layer 48 damage due to hot hole injection is reduced.

The ionic species for the source implant 86 comprises either arsenic or phosphorous. The ions are implanted with a dose of $5 \times 10^{15}$ atoms/cm$^2$ and $8 \times 10^{15}$ atoms/cm$^2$ and energy of between about 50 KeV and 70 KeV. The source junctions 90 formed by this implantation 68 have a junction depth of between about 0.5 microns and 0.8 microns and a doping ion concentration of between about $1 \times 10^{20}$ atoms/cm$^3$ and $2 \times 10^{20}$ atoms/cm$^3$.

Figure 8:
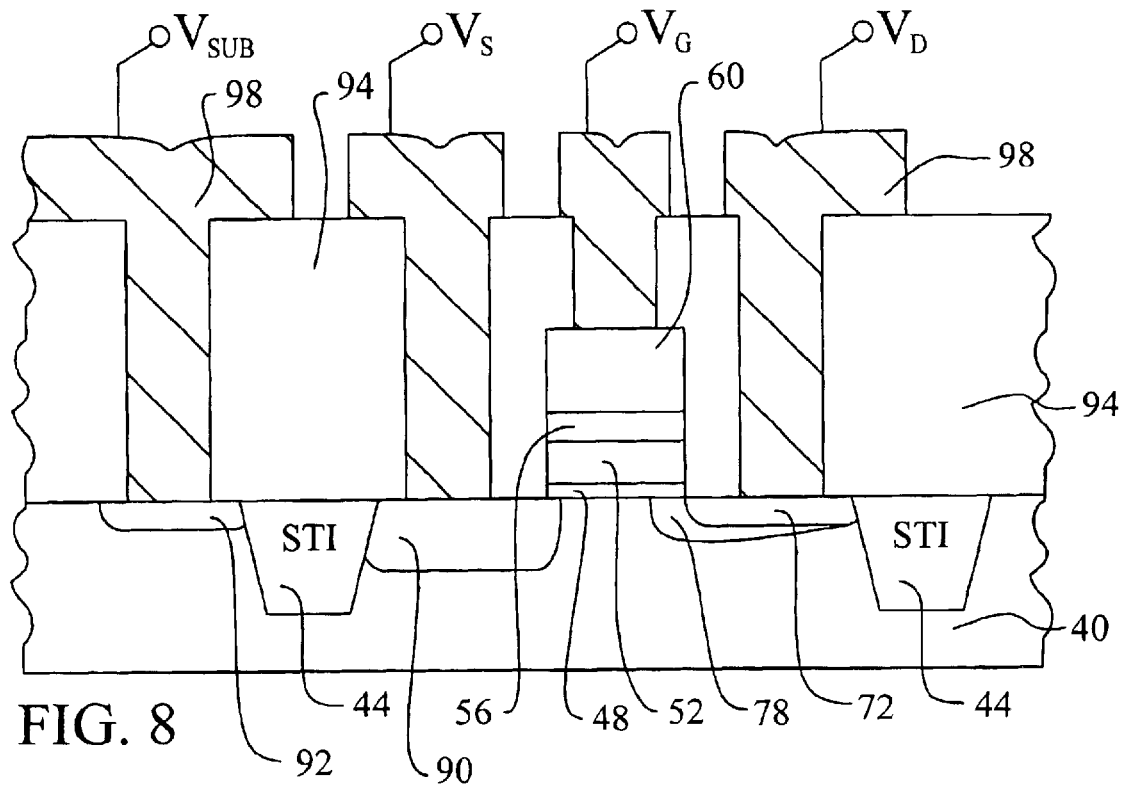

Referring now to FIG. 8, the device is completed in a conventional manner. A semiconductor contact junction 92 is formed in the semiconductor substrate 40 by an ion implantation. An interlevel dielectric layer 94 is deposited overlying the semiconductor substrate 40 and the control gates 60. The interlevel dielectric layer 94 is patterned to form contact openings. A metal layer 98 is deposited overlying the interlevel dielectric layer 94 and filling the contact openings. The metal layer 98 is etched to form separate connective traces, and the Flash EEPROM memory cell in the integrated circuit device is completed.

Referring again to FIG. 8, the completed Flash EEPROM memory cell of the present invention is herein described. A tunneling oxide layer 48 overlies the semiconductor substrate 40. The semiconductor substrate comprises monocrystalline silicon and is preferably lightly doped. The tunneling oxide layer 48 is preferably between about 80 Angstroms and 120 Angstroms thick. A floating gate 52 overlies the tunneling oxide layer 48. The floating gate 52 preferably comprises polysilicon and is between about 1000 Angstroms and 2000 Angstroms thick. An interpoly dielectric layer 56 overlies the floating gate 56. The interpoly dielectric, which may comprise silicon dioxide, silicon nitride, or a combination of both silicon dioxide and silicon nitride, is preferably between about 100 Angstroms and 150 Angstroms thick compared to an equivalent oxide layer. A control gate 60 overlies the interpoly oxide layer 56. The control gate 60 preferably comprises polysilicon and is between about 1000 Angstroms and 2000 Angstroms thick.

A shallow and abrupt drain junction 72 lies within the semiconductor substrate 40. The drain junction 72 has a junction depth of between about 0.2 microns and 0.3 microns and a doping ion concentration of between about $1 \times 10^{20}$ atoms/cm$^3$ and $2 \times 10^{20}$ atoms/cm$^3$. An angled pocket junction 78 lies within the semiconductor substrate 40 adjacent to the drain junction 72 and counter-doped to the drain junction 72. The angled pocket junction 78 has a junction depth of between about 0.3 microns and 0.4 microns and a doping ion concentration of between about $1 \times 10^{17}$ atoms/cm$^3$ and $2 \times 10^{17}$ atoms/cm$^3$. A deeper and less abrupt source junction 90 lies within the semiconductor substrate 40. The source junction 90 has a junction depth of between about 0.5 microns and 0.6 microns and a doping ion concentration of between about $1 \times 10^{20}$ atoms/cm$^3$ and $2 \times 10^{20}$ atoms/cm$^3$.

Referring now to FIG. 9, the programming mechanism of the present invention is described. The schematic representation shows the voltage biases necessary to program the Flash EEPROM memory cell of the type disclosed in the preferred embodiments of the present invention. A voltage, $V_D$, is applied to the drain junction of the cell to effect a low positive bias above a common ground reference. Here, $V_D$ is between about 3 volts and 5 volts. A voltage is applied to the control gate, $V_G$, of the cell to effect a low positive bias above the common ground reference. $V_G$ is between about 3 volts and 5 volts. A voltage is applied to the substrate, $V_{SUB}$, of the cell to effect a low negative bias below the common ground reference. $V_{SUB}$ is between about −3 volts and −5 volts. Finally, the source, $V_S$, of the cell is allowed to float.

In this configuration, a large enough reverse bias exists on the drain to substrate junction to cause an avalanche breakdown. The avalanche breakdown, and subsequent impact ionization in the substrate, serves as a source for energized, hot electrons for programming the memory cell. The positive potential, or back bias, from the control gate to the substrate cause the hot electrons to be injected into the floating gate. Note especially that this programming method does not require a doubling or tripling of the low voltage supply. The terminals of the memory cell only see low voltages. This means that the expensive thick gate oxide process is not needed. In addition, no charge pumping circuits are needed.

Referring now to FIG. 10, the erasing mechanism of the present invention is described. The schematic representation shows the voltage biases necessary to erase the Flash EEPROM memory cell. A voltage, $V_s$, is applied to the source junction of the cell to effect a low positive bias above a common ground reference. Here, $V_s$ is between about 3 volts and 5 volts and is shown at 5 Volts. A voltage is applied to the control gate, $V_G$, of the cell to effect a low negative bias below the common ground reference. $V_G$ is between about −3 Volts and −5 Volts. A voltage is applied to the substrate, $V_{SUB}$, of the cell to effect a low negative bias below the common ground reference. $V_{SUB}$ is between about 0 volts and −2 volts. Finally, the drain, $V_D$, of the cell is allowed to float.

In this configuration, a large enough reverse bias exists on the source to substrate junction to cause an avalanche breakdown. The avalanche breakdown, and subsequent impact ionization in the substrate, serves as a source for energized, hot holes for erasing the memory cell. The negative potential, or back bias, from the control gate to the substrate cause the hot holes to be injected into the floating gate. Note especially that this erasing method does not require a doubling or tripling of the low voltage supply. The terminals of the memory cell only see low voltages. Again, no expensive thick gate oxide process or charge pumping circuits are needed.

Figure 11:
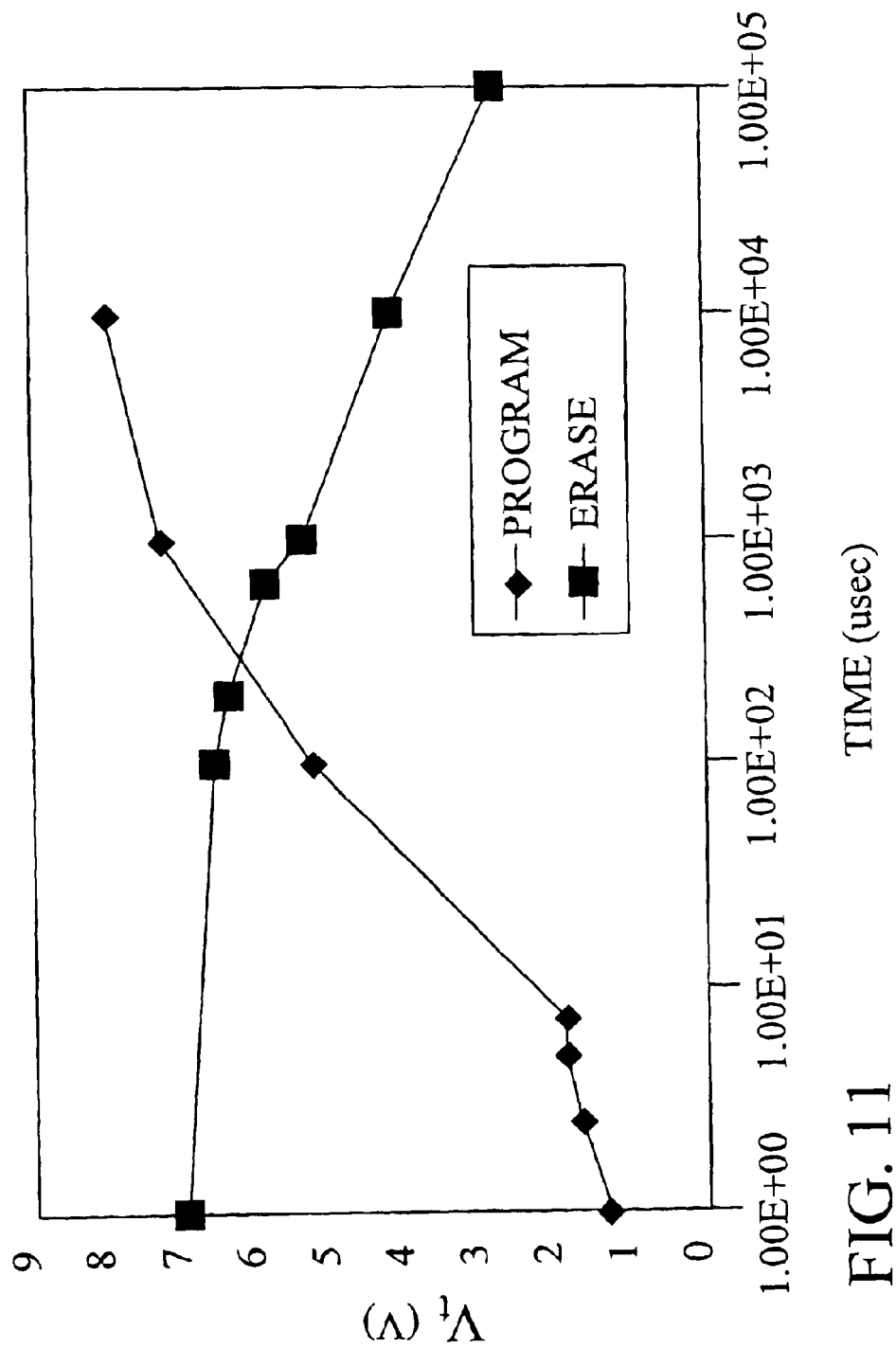
FIG. 11 graphically illustrates programming and erasing characteristics of the present invention.

Referring now to FIG. 11, the programming and erasing characteristics of the preferred embodiment of the present invention is described. Based on actual device data, the plot shows programming times of between about 30 milliseconds and 50 milliseconds.

As shown in the preferred embodiments, the present invention provides a very manufacturable process for fabricating a Flash EEPROM memory cell in an integrated circuit device. The Flash EEPROM memory cell is described and methods to program and erase the memory cell are disclosed. Experimental data confirms the usefulness of the novel invention.

While the invention has been particularly shown and described with reference to the preferred embodiments thereof, it will be understood by those skilled in the art that various changes in form and details may be made without departing from the spirit and scope of the invention.

What is claimed is:

1. A method of programming a Flash EEPROM memory cell device, wherein said Flash EEPROM memory cell comprises:

a semiconductor substrate;

a tunneling oxide layer overlying said semiconductor substrate;

a floating gate overlying said tunneling oxide;

an interpoly dielectric overlying said floating gate;

a control gate overlying said interpoly dielectric;

a shallow and abrupt drain junction within said semiconductor substrate adjacent to said tunneling oxide layer;

an angled pocket junction lying within said semiconductor substrate adjacent to said drain junction and counter-doped to said drain junction; and a deeper and less abrupt source junction lying within said semiconductor substrate; wherein said method of programming said Flash EEPROM cell comprises the steps of:

applying a voltage to said drain junction of said cell to effect a positive bias above a common ground reference;

applying a voltage to said control gate of said cell to effect a positive bias above said common ground reference;

applying a voltage to said substrate of said cell to effect a negative bias below said common ground reference;

floating said source junction of said cell; and charging said floating gate of said cell by back bias hot electron injection sufficiently to program said cell.

2. The method according to claim 1 wherein said step of applying a voltage to said drain junction is between about 3 volts and 5 volts.

3. The method according to claim 1 wherein said step of applying a voltage to said control gate is between about 3 volts and 5 volts.

4. The method according to claim 1 wherein said step of applying a voltage to said substrate is between about −3 volts and −5 volts.

* * * * *